(12) United States Patent
Ushiyama et al.

(10) Patent No.: US 7,009,532 B2
(45) Date of Patent: Mar. 7, 2006

(54) DVD RECORDING METHOD AND REWRITABLE DVD APPARATUS

(75) Inventors: Junko Ushiyama, Kokubunji (JP); Hiroyuki Minemura, Kokubunji (JP)

(73) Assignees: Hitachi, Ltd., Tokyo (JP); Hitachi-LG Data Storage, Inc., Tokyo (JP)

( * ) Notice: Subject to any disclaimer, the term of this patent is extended or adjusted under 35 U.S.C. 154(b) by 18 days.

(21) Appl. No.: 10/902,053

(22) Filed: Jul. 30, 2004

(65) Prior Publication Data

US 2005/0140528 A1    Jun. 30, 2005

(30) Foreign Application Priority Data

Dec. 24, 2003    (JP)    ............................ 2003-426166

(51) Int. Cl.
*H03M 7/00*    (2006.01)
(52) U.S. Cl. ............................ 341/59; 341/58; 341/68; 360/41; 369/59.24
(58) Field of Classification Search ............ 341/58–59, 341/68–69; 360/41; 369/59.24
See application file for complete search history.

(56) References Cited

U.S. PATENT DOCUMENTS 5,333,126 A    7/1994    Fukuda et al.
6,297,753 B1 *    10/2001    Hayami .................... 341/59
6,492,920 B1 *    12/2002    Oki et al. ................... 341/106
6,573,848 B1 *    6/2003    Hayami .................... 341/68
6,670,896 B1 *    12/2003    Hayami .................... 341/59
6,737,996 B1    5/2004    Kurokawa et al.
6,861,965 B1 *    3/2005    Kayanuma et al. .......... 341/59
2001/0002189 A1    5/2001    Miyamoto et al.

FOREIGN PATENT DOCUMENTS

| JP | 62-272726 | 11/1987 |
| JP | 5-225709 | 9/1993 |
| JP | 11-177430 | 7/1999 |
| JP | 2002-197662 | 7/2002 |

\* cited by examiner

*Primary Examiner*—Peguy Jeanpierre
*Assistant Examiner*—Khai Nguyen
(74) *Attorney, Agent, or Firm*—Antonelli, Terry, Stout and Kraus, LLP.

(57) ABSTRACT

The DVD recording method is intended to increase the number of cycles allowed for recording on the disk an enormous number of times. This method comprises generating two data streams by using a plurality of code mapping variants prepared for coding input data, quasi-randomly selecting one of the plurality of code mapping variants, if absolute DSVs of the two streams are substantially equal, and converting into recording code sequences. This method prevents deterioration of the disk particularly in the management area and increases the number of cycles allowed for rewriting.

15 Claims, 10 Drawing Sheets

FIG.9

| DATA SYMBOL | STATE 1 CODE WORD MSB      LSB | NEXT STATE | STATE 2 CODE WORD MSB      LSB | NEXT STATE | STATE 3 CODE WORD MSB      LSB | NEXT STATE | STATE 4 CODE WORD MSB      LSB | NEXT STATE |
|---|---|---|---|---|---|---|---|---|
| 0 | 0010000000001001 | 1 | 0100000100100000 | 2 | 0010000000001001 | 1 | 0100000100100000 | 2 |
| 1 | 0010000000010010 | 1 | 0010000000010010 | 1 | 1000000100100000 | 3 | 1000000100100000 | 3 |
| 2 | 0010000100100000 | 2 | 0010000100100000 | 2 | 1000000000010010 | 1 | 1000000000010010 | 1 |
| 3 | 0010000001001000 | 2 | 0100010010000000 | 4 | 0010000001001000 | 2 | 0100010010000000 | 4 |
| 4 | 0010000010010000 | 2 | 0010000010010000 | 2 | 1000000100100000 | 2 | 1000000100100000 | 2 |
| 5 | 0010000000100100 | 2 | 0010000000100100 | 2 | 1001001000000000 | 4 | 1001001000000000 | 4 |
| 6 | 0010000000100100 | 3 | 0010000000100100 | 3 | 1000100100000000 | 4 | 1000100100000000 | 4 |
| 7 | 0010000001001000 | 3 | 0100000000010010 | 1 | 0010000001001000 | 3 | 0100000000010010 | 1 |
| 8 | 0010000010010000 | 3 | 0010000010010000 | 3 | 1000010010000000 | 4 | 1000010010000000 | 4 |
| 9 | 0010000100100000 | 3 | 0010000100100000 | 3 | 1001001000000001 | 1 | 1001001000000001 | 1 |
| 10 | 0010010010000000 | 4 | 0010010010000000 | 4 | 1000100100000001 | 1 | 1000100100000001 | 1 |
| 11 | 0010001001000000 | 4 | 0010001001000000 | 4 | 1000000010010000 | 3 | 1000000010010000 | 3 |
| 12 | 0010010010000001 | 1 | 0010010010000001 | 1 | 1000000010010000 | 2 | 1000000010010000 | 2 |
| 13 | 0010001001000001 | 1 | 0010001001000001 | 1 | 1000010010000001 | 1 | 1000010010000001 | 1 |
| 14 | 0010000001001001 | 1 | 0100000000100100 | 3 | 0010000001001001 | 1 | 0100000000100100 | 3 |
| 15 | 0010000100100001 | 1 | 0010000100100001 | 1 | 1000001001000001 | 1 | 1000001001000001 | 1 |
| 16 | 0010000010010001 | 1 | 0010000010010001 | 1 | 1000000100100001 | 1 | 1000000100100001 | 1 |
| 17 | 0010000000100010 | 1 | 0010000000100010 | 1 | 1000001001000000 | 4 | 1000001001000000 | 4 |
| 18 | 0001000000001001 | 1 | 0100000010010000 | 2 | 0001000000001001 | 1 | 0100000010010000 | 2 |
| 19 | 0010000000010001 | 1 | 0010000000010001 | 1 | 1001000100000000 | 4 | 1001000100000000 | 4 |
| 20 | 0001000000010010 | 1 | 0001000000010010 | 1 | 1000010010000000 | 4 | 1000010010000000 | 4 |
| 21 | 0000100000000010 | 1 | 0000100000000010 | 1 | 1000000010010001 | 1 | 1000000010010001 | 1 |
| 22 | 0000010000000001 | 1 | 0000010000000001 | 1 | 1000000001001001 | 1 | 1000000001001001 | 1 |
| 23 | 0010001000100000 | 2 | 0010001000100000 | 2 | 1000000001001000 | 2 | 1000000001001000 | 2 |
| 24 | 0010000100010000 | 2 | 0010000100010000 | 2 | 1000000001001000 | 3 | 1000000001001000 | 3 |
| 25 | 0010000010001000 | 2 | 0100000000100100 | 2 | 0010000010001000 | 2 | 0100000000100100 | 2 |
| 26 | 0010000001000100 | 2 | 0010000001000100 | 2 | 1000000000100010 | 1 | 1000000000100010 | 1 |
| 27 | 0001000100100000 | 2 | 0001000100100000 | 2 | 1000000000010001 | 1 | 1000000000010001 | 1 |
| 28 | 0010000000001000 | 2 | 0100000010010000 | 3 | 0010000000001000 | 2 | 0100000010010000 | 3 |
| 29 | 0001000010010000 | 2 | 0001000010010000 | 2 | 1001001000000010 | 1 | 1001001000000010 | 1 |
| 30 | 0001000001001000 | 2 | 0100000100100000 | 3 | 0001000001001000 | 2 | 0100000100100000 | 3 |
| 31 | 0001000000100100 | 2 | 0001000000100100 | 2 | 1001000100000001 | 1 | 1001000100000001 | 1 |
| 32 | 0001000000000100 | 2 | 0001000000000100 | 2 | 1000100100000010 | 1 | 1000100100000010 | 1 |
| 33 | 0001000000000100 | 3 | 0001000000000100 | 3 | 1000100010000001 | 1 | 1000100010000001 | 1 |
| 34 | 0001000000100100 | 3 | 0001000000100100 | 3 | 1000000000100100 | 2 | 1000000000100100 | 2 |
| 35 | 0001000001001000 | 3 | 0100001001000000 | 4 | 0001000001001000 | 3 | 0100001001000000 | 4 |
| 36 | 0001000010010000 | 3 | 0001000010010000 | 3 | 1000000000100100 | 3 | 1000000000100100 | 3 |
| 37 | 0001000100100000 | 3 | 0001000100100000 | 3 | 1000010001000000 | 4 | 1000010001000000 | 4 |
| 38 | 0010000000001000 | 3 | 0100100100000001 | 1 | 0010000000001000 | 3 | 0100100100000001 | 1 |
| 39 | 0010000001000100 | 3 | 0010000001000100 | 3 | 1001000010000000 | 4 | 1001000010000000 | 4 |
| 40 | 0010000010001000 | 3 | 0100010010000001 | 1 | 0010000010001000 | 3 | 0100010010000001 | 1 |
| 41 | 0010000100010000 | 3 | 0010000100010000 | 3 | 1000010010000010 | 1 | 1000010010000010 | 1 |
| 42 | 0010001000100000 | 3 | 0010001000100000 | 3 | 1000001000100000 | 2 | 1000001000100000 | 2 |
| 43 | 0010010001000000 | 4 | 0010010001000000 | 4 | 1000010001000001 | 1 | 1000010001000001 | 1 |
| 44 | 0001001001000000 | 4 | 0001001001000000 | 4 | 1000001000100000 | 3 | 1000001000100000 | 3 |
| 45 | 0000001000000001 | 1 | 0100010001000000 | 4 | 1000001001000010 | 1 | 0100010001000000 | 4 |

FIG.10

| DATA SYMBOL | STATE 1 CODE WORD MSB        LSB | NEXT STATE | STATE 2 CODE WORD MSB        LSB | NEXT STATE | STATE 3 CODE WORD MSB        LSB | NEXT STATE | STATE 4 CODE WORD MSB        LSB | NEXT STATE |
|---|---|---|---|---|---|---|---|---|
| 0 | 0000010010000000 | 4 | 0000010010000000 | 4 | 0100100001001000 | 2 | 0100100001001000 | 2 |
| 1 | 0000100010000000 | 4 | 0000100010000000 | 4 | 0100100001001000 | 3 | 0100100001001000 | 3 |
| 2 | 0001001000000000 | 4 | 0001001000000000 | 4 | 0100100000001001 | 1 | 0100100000001001 | 1 |
| 3 | 0000001001000000 | 4 | 0100010000000001 | 1 | 1000001000000000 | 4 | 0100010000000001 | 1 |
| 4 | 0000000100100000 | 3 | 0100100000000010 | 1 | 1001000000000100 | 3 | 0100100000000010 | 1 |
| 5 | 0000000010010000 | 3 | 0100001000000000 | 4 | 1001000000100100 | 3 | 0100001000000000 | 4 |
| 6 | 0000000001001000 | 3 | 0100100000000100 | 2 | 1001000001001000 | 3 | 0100100000000100 | 2 |
| 7 | 0000000001001000 | 2 | 0100000100000000 | 4 | 1001000000000100 | 2 | 0100000100000000 | 4 |
| 8 | 0000000010010000 | 2 | 0100100010010000 | 3 | 1001000000100100 | 2 | 0100100010010000 | 3 |
| 9 | 0000000100100000 | 2 | 0100100000100100 | 2 | 1001000001001000 | 2 | 0100100000100100 | 2 |
| 10 | 0000010001000000 | 4 | 0000010001000000 | 4 | 1001001001000000 | 4 | 1001001001000000 | 4 |
| 11 | 0000100001000000 | 4 | 0000100001000000 | 4 | 1000100001001000 | 3 | 1000100001001000 | 3 |
| 12 | 0001000100000000 | 4 | 0001000100000000 | 4 | 0100010001001000 | 3 | 0100010001001000 | 3 |
| 13 | 0010001000000000 | 4 | 0010001000000000 | 4 | 1000100000000100 | 3 | 1000100000000100 | 3 |
| 14 | 0000001000100000 | 3 | 0100100000000100 | 3 | 1001000010010000 | 3 | 0100100000000100 | 3 |
| 15 | 0000000100010000 | 3 | 0100100010010000 | 2 | 1001000100100000 | 3 | 0100100010010000 | 2 |
| 16 | 0000000010001000 | 3 | 0100001000000001 | 1 | 0100100000001000 | 3 | 0100001000000001 | 1 |
| 17 | 0000000001000100 | 3 | 0100001000000010 | 1 | 0100100010001000 | 3 | 0100001000000010 | 1 |
| 18 | 0000000001000100 | 2 | 0100100000100100 | 3 | 1001000010010000 | 2 | 0100100000100100 | 3 |
| 19 | 0000000010001000 | 2 | 0100100100100000 | 3 | 1001000100100000 | 2 | 0100100100100000 | 3 |
| 20 | 0000000100010000 | 2 | 0100100100100000 | 2 | 0100010001001000 | 2 | 0100100100100000 | 2 |
| 21 | 0000001000100000 | 2 | 0100100000010010 | 1 | 0100100000001000 | 2 | 0100100000010010 | 1 |
| 22 | 0000010010000001 | 1 | 0000010010000001 | 1 | 1000100000100100 | 3 | 1000100000100100 | 3 |
| 23 | 0000100100000001 | 1 | 0000100100000001 | 1 | 1000100010010000 | 3 | 1000100010010000 | 3 |
| 24 | 0001001000000001 | 1 | 0001001000000001 | 1 | 0100100010001000 | 2 | 0100100010001000 | 2 |
| 25 | 0010010000000001 | 1 | 0010010000000001 | 1 | 1000100000000100 | 2 | 1000100000000100 | 2 |
| 26 | 0000000001001001 | 1 | 0100010000000100 | 3 | 1000010000000001 | 1 | 0100010000000100 | 3 |
| 27 | 0000000010010001 | 1 | 0100000100000001 | 1 | 1000100000000010 | 1 | 0100000100000001 | 1 |
| 28 | 0000000100100001 | 1 | 0100010000000100 | 2 | 1001000000001001 | 1 | 0100010000000100 | 2 |
| 29 | 0000001001000001 | 1 | 0100000100000010 | 1 | 1001000000010010 | 1 | 0100001000000010 | 1 |
| 30 | 0000100001000000 | 4 | 0000100001000000 | 4 | 1000100000100100 | 2 | 1000100000100100 | 2 |
| 31 | 0001000010000000 | 4 | 0001000010000000 | 4 | 1000100001001000 | 2 | 1000100001001000 | 2 |
| 32 | 0010000100000000 | 4 | 0010000100000000 | 4 | 0100010000001001 | 1 | 0100010000001001 | 1 |
| 33 | 0000010000100000 | 3 | 0000010000100000 | 3 | 0100100001001001 | 1 | 0100100001001001 | 1 |
| 34 | 0000001000010000 | 3 | 0100010000010010 | 1 | 1000100100100000 | 3 | 0100010000010010 | 1 |
| 35 | 0000000100001000 | 3 | 0100100000010001 | 1 | 1001000000001000 | 3 | 0100100000010001 | 1 |
| 36 | 0000000010000100 | 3 | 0100000010000000 | 4 | 1001000001000100 | 3 | 0100000010000000 | 4 |
| 37 | 0000010000100000 | 2 | 0000010000100000 | 2 | 1000001000000001 | 1 | 1000001000000001 | 1 |
| 38 | 0000000010000100 | 2 | 0100010000100100 | 3 | 1000100010010000 | 2 | 0100010000100100 | 3 |
| 39 | 0000000100001000 | 2 | 0100010000100100 | 2 | 1000100100100000 | 2 | 0100010000100100 | 2 |
| 40 | 0000001000010000 | 2 | 0100100000100010 | 1 | 1001000000001000 | 2 | 0100100000100010 | 1 |
| 41 | 0000010001000001 | 1 | 0000010001000001 | 1 | 1000010000000010 | 1 | 1000010000000010 | 1 |
| 42 | 0000010010000010 | 1 | 0000010010000010 | 1 | 1000000100000000 | 4 | 1000000100000000 | 4 |
| 43 | 0000100010000001 | 1 | 0000100010000001 | 1 | 1001000001000100 | 2 | 1001000001000100 | 2 |
| 44 | 0000100100000010 | 1 | 0000100100000010 | 1 | 1000100000001001 | 1 | 1000100000001001 | 1 |
| 45 | 0001000100000001 | 1 | 0001000100000001 | 1 | 1001000010001000 | 3 | 1001000010001000 | 3 |
| 46 | 0001001000000010 | 1 | 0001001000000010 | 1 | 1001000100010000 | 3 | 1001000100010000 | 3 |

DVD RECORDING METHOD AND REWRITABLE DVD APPARATUS

CLAIM OF PRIORITY

The present application claims priority from Japanese application JP 2003-426166 filed on Dec. 24, 2003, the content of which is hereby incorporated by reference into this application.

FIELD OF THE INVENTION

The present invention relates to a DVD recording method and apparatus which record information by forming recording marks whose physical characteristics differ from other portions on the recording medium.

BACKGROUND OF THE INVENTION

Recording information onto optical disks is performed by modulating light intensity and forming recording marks on the media. To do this, a coding scheme and circuit to record digital signals onto the recording media are required. In general, run length limited coding has been used. In the run length coding rule (RLL constraints), information is recorded by NRZI modulation coding in which pulse polarity is inverted only when a "1" bit of code is encountered and information can be stored on both edges of a recording mark, namely, edge mark recording.

After coding original data incoming from the host, the coded data includes DC components because the time width of one polarity pulses is longer than that of the other polarity pulses. Because these DC components cause jitter to increase and errors, it is desirable to minimize the DC components.

To address this, there have been proposed techniques for making the Digital Sum Value (DSV) of a recording bit stream as close to zero as possible, a few of which will be cited below. A technique disclosed in JP-A No. 272726/1987 (patent document 1) inserts two types of sync signals into data to reduce the DC components and uses these two signals appropriately to set pulse polarity inversed or not inversed just before the next sync signal.

A technique disclosed in JP-A No. 225709/1993 (patent document 2) incorporates a plurality of resync signal patterns at given intervals in recording bit stream signals, one of these patterns having an odd number of polarity reversals and the other having an even number of polarity reversals, and selects a pattern appropriate for a recording data pattern to reduce the DSV.

A technique disclosed in JP-A No. 177430/1999 (patent document 3) divides a bit stream into segments and calculates the DSVs of the segments. This technique carries out DSV control by comparing the DSV of a new segment with the total DSV of the previous segments and determining whether or not to invert the polarity of the bits in the segment.

In order to increase the number of cycles allowed for repetitive writing on disk, for example, JP-A No. 197662/2002 discloses a polarity inversion technique for DVD-RAM disks, that is, this technique randomly inverts the mark and space positions each time rewriting is performed. RLL 8-16 modulation that is used for DVDs encodes user data in edge positions. Therefore, because of edge recording, information is recorded in both marks (amorphous) and spaces (crystalline) of a pattern recorded on the disk. Taking advantage of the 8-16 modulation characteristics and data area separated into sectors, DVD rewritable lifespan is enhanced by randomly placing a mark or space in the beginning position of each sector to prevent only marks (or spaces) from being present in fixed positions of recorded patterns. This is called a polarity inversion method.

Using various techniques as above, rewritable DVDs satisfy the required number of cycles: not less than 1,000 for DVD-RW and not less than 100,000 for DVD-RAM.

[Patent Document 1] JP-A No. 272726/1987
[Patent Document 2] JP-A No. 225709/1993
[Patent Document 3] JP-A No. 177430/1999
[Patent Document 4] JP-A No. 197662/2002

SUMMARY OF THE INVENTION

In view of social demand for recording technology such as the currently growing network world and increasing information amount to handle, it is necessary to further increase the number of cycles allowed for repetitive recording on DVD. Particularly, a management area, where frequent rewriting in same positions is needed, is liable to deteriorate.

It is an object of the present invention to further increase the number of cycles allowed for repetitive recording on an optical disk.

First, the result of examination for damage to the recording layer after a predetermined number of cycles of recording is shown in FIG. 8. After 100,000 cycles of recording of equal-length pulse sequences consisting of marks and spaces (so-called C/N patterns) on a DVD-RAM disk, change in reflectivity observed in leading edges was measured. The measurements were plotted in the graph of FIG. 8. As is apparent in FIG. 8, reflectivity greatly varies, depending on the mark length, and it is seen that deterioration becomes harder as the mark becomes shorter. To improve data errors due to deterioration depending on the mark length like this, it is not sufficient to use the above polarity inversion method. This is because, even if its polarity is inverted, a mark (or space) recorded in a fixed position is constant in length.

Then, it turned out that the data patterns to be recorded must be changed each time of rewriting to make the deterioration of the medium depending on the mark length uniform throughout the medium.

To achieve the above object, the present invention has been constituted as follows:

(1) A DVD recording method comprises generating two data streams by using a plurality of code mapping variants prepared for coding input data, quasi-randomly selecting one of the plurality of code mapping variants, if absolute DSVs of the two streams are substantially equal, and converting into recording code sequences.

Specifically, the DVD recording method conforming to DVD-RW Specifications is as follows. As the 8-16 modulation coding is used in the DVD-RW Specifications, an 8-bit data symbol (corresponding to one byte of user data) is converted into a 16-bit code word by using conversion tables. Two conversion tables are prepared: a main conversion table and a substitution table. The main conversion table is shown in FIG. 9 and the substitution table is shown in FIG. 10. In FIGS. 9 and 10, a "Data symbol" is an 8-bit data symbol, a "Code Word" is a 16-bit code word, and one 8-bit data symbol is associated with four states (State 1, State 2, State 3, and State 4) of 16-bit code words. A 16-bit code word in each state is linked to a "Next State" defined for it. Not only is a 16-bit code word corresponding to an 8-bit data symbol, but also the next state of 16-bit code word to which the symbol will be encoded is defined. Referring to the main conversion table of FIG. 9, this "next state" linkage will be explained. For example, when 8-bit data symbols to be encoded are a data sequence of "7, 8, and 9," if symbol "7" is determined to be mapped to a "state 1" code word, it is determined that the next symbol "8" is mapped to a state 3 code word, according to the table. Looking at the state 3 code word corresponding to symbol "8," "4" is specified for "Next State" and, thus, the next symbol "9" is mapped to a state 4 code word.

Using these tables, (A) as for 8-bit data symbols ranging from 0 to 87, the substitution table can be used instead of the main conversion table; (B) as for 8-bit data symbols ranging from 88 to 255, if the specified state is 1 or 4, and if run length requirements are satisfied, 16-bit code words of state 1 or 4 mapped to the data symbols can be selected. This method keeps DSV low. Because there is no substitution table for the 8-bit data symbols ranging from 88 to 255 mentioned in (B), selectable code words are increased by the above method. (C) As for SYNC, either primary or secondary SYNC code can be selected. This method suppresses DC components.

As is shown in FIG. 12, a physical sector configuration consists of 13 rows, each row consisting of two sync frames. One sync frame consists of one synchronous code (SY) and 1456 channel bits. The 1456 channel bits represent first and second sets of 91 8-bit data symbols in each frame on one row of recording frames. For information to be recorded, two data streams are generated for each sync frame. The DSVs of the two data streams generated for each sync frame are compared and a data stream whose DSV is smaller is selected.

Based on the above specifications, concretely, the DVD recording method is performed as follows. When the absolute |DSVs| for accumulated DSVs up to the 16 bits of the two data streams generated per sync frame are equal, as for the 8-bit data symbols from 0 to 87 corresponding to 16-bit code words to be selected, either the stream defined in the main conversion table or the stream defined in the substitution table is randomly selected as the 16-bit code words. As for the 8-bit data symbols from 88 to 255, either the stream defined in state 1 or the stream defined in state 4 is quasi-randomly selected as the 16-bit code words.

The conditions of writing on an optical disk are severest when the same information is repeatedly recorded in the same recording pattern. A rewritable-type DVD apparatus repeats comparing the DSVs of the two streams and selecting one of the streams when encoding data. Normally, when certain user data is recorded, accumulated DSVs of the two data streams generated per sync frame are calculated and one stream having the absolute DSV which is smaller is selected. By the way, we examined commercially available rewritable DVD devices about how they get code words when the two streams have equal absolute DSVs. As a result, it turned out that the devices select the main conversion table in that case.

In the present invention, in that case, either the 16-bit code words defined in the main conversion table or those defined in the substitution table is selected quasi-randomly. This selecting manner avoids that the same recording pattern is formed again even if the same information is overwritten and, consequently, inter-mark gaps, that is, space between one recording mark and another recording mark, become varying. Therefore, the invented method can prevent the same recording mark from being recorded in the same position an enormous number of times and overcomes the problem of uneven medium deterioration depending on the mark length as shown in FIG. 8. By this method, for example, an 11T recording mark may be formed over a previous 3T mark. Like this, by changing the recording mark length each time rewriting is performed, the effect of preventing deterioration from being intensive in fixed positions can be obtained. Consequently, the number of cycles allowed for rewriting can be increased.

(2) Another aspect of the invention resides in an information recording method for recording digital data onto an optical disk. In this method, SYNC is selected quasi-randomly between primary SYNC code and secondary SYNC code when the |DSVs| of two data streams generated for the sync frames are substantially equal. When selecting SYNC, in the same way as described above, when certain user data is recorded, accumulated DSVs of the two data streams generated per sync frame are calculated and one stream whose absolute DSV is smaller is selected. Meanwhile, when the data streams have equal |DSVs|, most devices select the primary SYNC code. In the present invention, quasi-randomly selecting between primary SYNC code and secondary SYNC code is performed when selecting SYNC. This selecting manner can prevent the same recording mark from being recorded in the same position an enormous number of times as is the case for the method of (1).

(3) When the two data streams generated per sync frame have equal |DSVs|, a 16-bit code words plus SYNC pattern per certain unit of recording is selected quasi-randomly from the following eight patterns: main conversion table, state 1, and primary SYNC code; main conversion table, state 1, and secondary SYNC code; main conversion table, state 4, and primary SYNC code; main conversion table, state 4, and secondary SYNC code; substitution table, state 1, and primary SYNC code; substitution table, state 1, and secondary SYNC code; substitution table, state 4, and primary SYNC code; and substitution table, state 4, and secondary SYNC code. The selected pattern is quasi-randomly changed each time rewriting is performed. Although the above modes of (1) and (2) may be performed independently, it is preferable to combine these modes quasi-randomly, so that recording mark positions can be distributed across the disk more uniformly and, consequently, deterioration of the disk material can be more suppressed. A merit is that selection is made per certain unit of recording, not per 16-bit code word and per SYNC, thus simplifying a disk drive program.

(4) When difference between the |DSVs| for up to the 16 bits of the two data streams generated per sync frame is approximately 10 or less, as for the 8-bit data symbols from 0 to 87 corresponding to 16-bit code words to be selected, either the stream defined in the main conversion table or the stream defined in the substitution table is quasi-randomly selected as the 16-bit code words. As for the 8-bit data symbols from 88 to 255, either the stream defined in state 1 or the stream defined in state 4 is quasi-randomly selected as the 16-bit code words. Normally, either stream whose accumulated |DSV| is smaller is selected.

However, it turned out that, if the difference between the accumulated |DSVs| is 10 or less, there is practically no effect on readback and other performances. The maximum difference between the accumulated |DSVs| up to which the above manners of selecting 16-bit code words and SYNC are allowed, will be referred to as a "|DSV| threshold value" hereinafter. FIG. 2 is a graph of jitter vs. |DSV| threshold value for a case where a DVD-RW disk is used. Here, the jitter is defined as follows. After same random data is EFM modulated and recorded repeatedly, the jitter is measured as standard deviation of time difference of readback data from a readback clock, normalized to a readback detection window width. As shown in FIG. 2, when the |DSV| threshold value is less than 10, no increase of the readback jitter is seen and good readback performance is exhibited. When the |DSV| threshold value is greater than 10, the readback jitter increases little by little, as shown in FIG. 2, and a problem of degrading signal performance arises, even though the manner of quasi-randomly selecting the appropriate stream mitigates the increase of the jitter after numerous cycles of rewriting from the initial recording. Therefore, it is preferable that the accumulated |DSV| threshold value is approximately 10 or less. When the |DSV| threshold value is approximately 10 or less, by quasi-randomly selecting either the stream defined in the main conversion table or the stream defined in the substation table as the 16-bit code words, more significant suppression of deterioration in rewrite performance, which is due to recording same information in same recording marks an enormous number of times, has been observed. It is more preferable that the |DSV| threshold value is 3 or less. Under this condition, rewrite performance can be enhanced without affecting readback performance, even taking account of disk performance variation such as jitter variation and the worst case of environment in which the disk is used.

(5) When difference between the |DSVs| of the two data streams generated per sync frame is approximately 10 or less, SYNC is selected quasi-randomly between primary SYNC code and secondary SYNC code. For the same reason as the above (4), when selecting SYNC, if the difference between the |DSVs| of the two data streams generated per sync frame is 10 or less, the appropriate SYNC code is quasi-randomly selected. Because the bit pattern of primary SYNC code differs from that of secondary SYNC code, a different |DSV| is obtained for the stream following the SYNC. It is preferable to use this manner, because this manner decreases the possibility of recording same information in same recording marks an enormous number of times and, consequently, can suppress deterioration of the disk material. Furthermore, for the same reason as described in the above (4), it is more preferable that the |DSV| threshold value is 3 or less; under this condition, the disk is more immune to disturbance.

(6) When difference between the |DSVs| of the two data streams generated per sync frame is approximately 10 or less, a 16-bit code words plus SYNC pattern per certain unit of recording is selected quasi-randomly from the following eight patterns: main conversion table, state 1, and primary SYNC code; main conversion table, state 1, and secondary SYNC code; main conversion table, state 4, and primary SYNC code; main conversion table, state 4, and secondary SYNC code; substitution table, state 1, and primary SYNC code; substitution table, state 1, and secondary SYNC code; substitution table, state 4, and primary SYNC code; and substitution table, state 4, and secondary SYNC code. The selected pattern is quasi-randomly changed each time rewriting is performed. Although the above modes of (4) and (5) may be performed independently, it is preferable to combine these modes quasi-randomly, so that recording mark positions can be distributed across the disk more uniformly and, consequently, deterioration of the disk material can be more suppressed. As is the case for (3), this mode of (6) has the merit of simplifying the disk drive program. Furthermore, for the same reason as described in the above (4), it is more preferable that the |DSV| threshold value is 3 or less; under this condition, the disk is more immune to disturbance.

(7) When recording new information subsequent to a previously recorded data area, the DSVs of the data streams recorded in the preceding blocks are measured, an accumulated value of the DSVs is set as the initial DSV when the new information is recorded, and encoding the data is performed. When recording new information subsequent to a previously recorded data segment, conventionally, the DSV is initialized to zero at the beginning of modulation and encoding is started, without regard to the accumulated DSV of recorded data. In this conventional method, because the previous data DSV is not taken into account at the start of recording, this method may give rise to a problem of a great difference between the DSV of old data and the DSV of new data. As this difference becomes great, the accuracy of RF signal detection when data is read may decrease and the readback performance may deteriorate. The method of the present invention measures the DSV of the recorded data segment before the start of encoding new data and sets the accumulated DSV for the initial DSV of a new data stream. As a result, the invented method can get the old and new data DSVs in succession and can provide stable readback performance The above modes of (1) through (7) are effective particularly for rewritable DVDs such as DVD-RW and DVD+RW.

(8) An information recording apparatus for recording digital data onto a rewritable DVD is equipped with a randomizer for quasi-randomly selecting between two streams when the absolute DSVs of the two data streams generated per sync frame are equal or when difference between the DSVs is approximately 10 or less in order to implement the above modes of (1) through (6).

The present invention is capable of increasing the number of cycles allowed for rewriting on recoding media, particularly, the number of cycles allowed for repetitive recording of same information, which is liable to occur in the data management area or the like, while satisfying the DVD specifications.

BRIEF DESCRIPTION OF THE DRAWINGS

FIG. 9 shows a main conversion table which is used for DVD-RW;

FIG. 10 shows a substitution table which is used for DVD-RW;

DETAILED DESCRIPTION OF THE PREFERRED EMBODIMENTS

Figure 1:
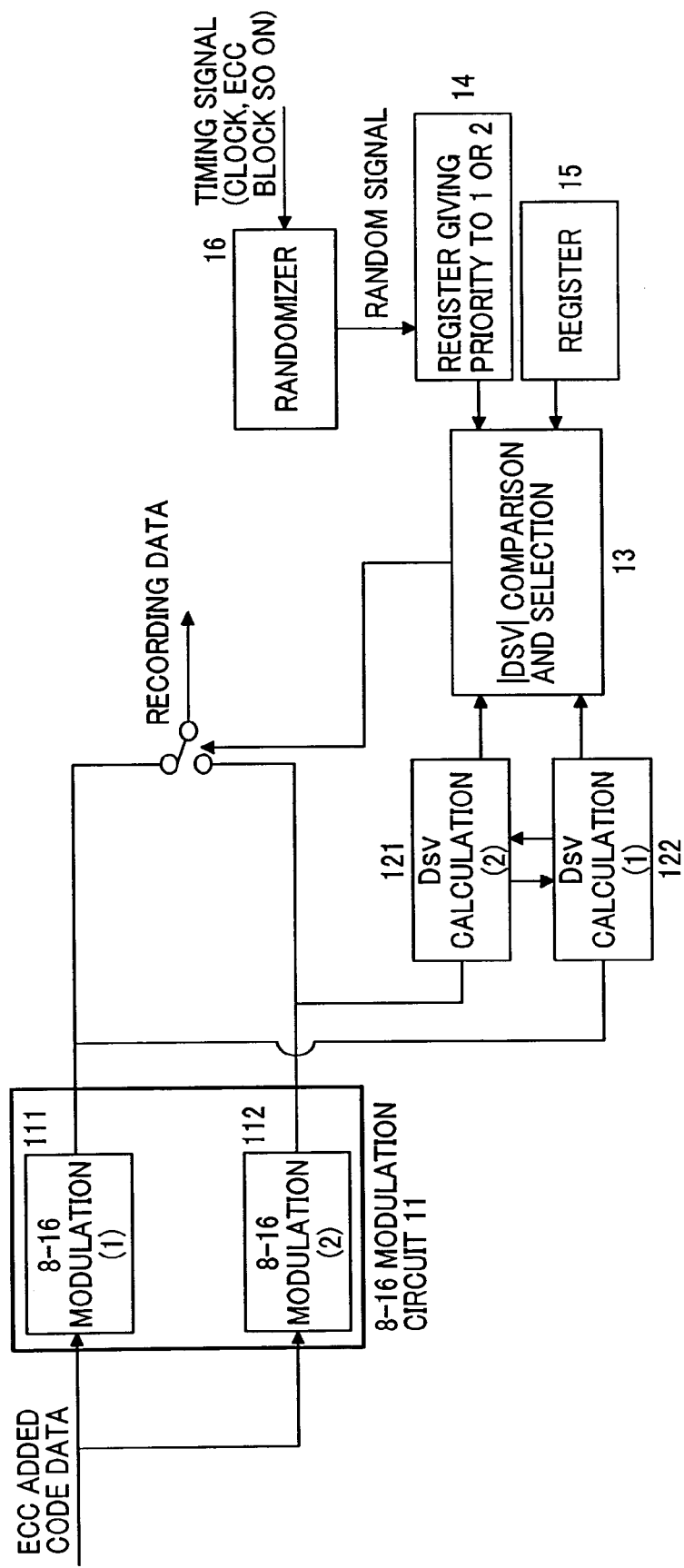
FIG. 1 is a diagram showing a partial structure of a DVD recording apparatus according to the present invention.
Figure 2:
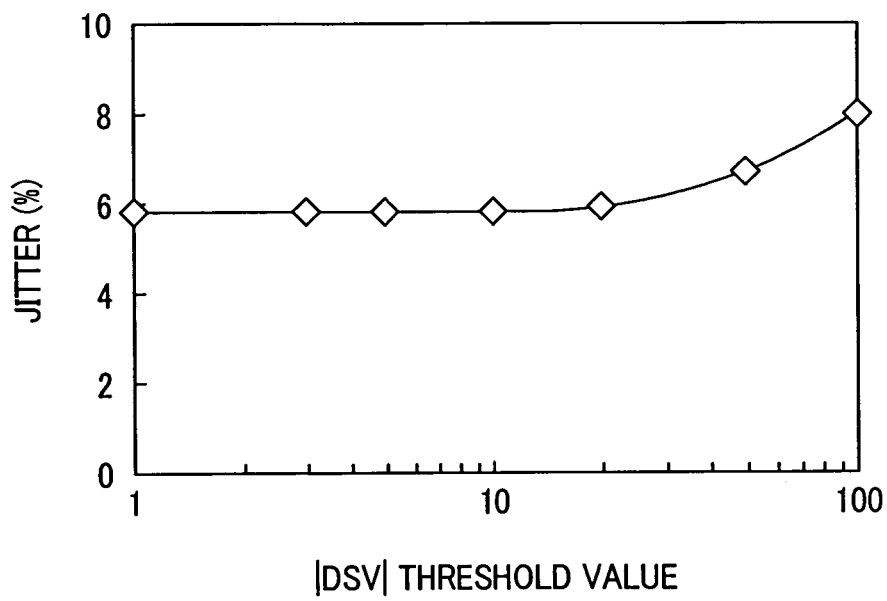
FIG. 2 is a graph showing a relationship between jitter and |DSV| threshold value in relation to the present invention.

The present invention is now described in more detail hereinafter by way of its preferred embodiments.

First Embodiment

In the case where the accumulated |DSVs| of two streams are equal when recording same information while satisfying the DSV control rule of the DVD specifications, Table 1 gives the percentages of edge position shifts and changed recording mark and space positions when either the main conversion table or the substitution table was selected for the 8-bit data symbols from 0 to 87, when either state 1 or state 4 was selected for the 8-bit data symbols from 88 to 255, and when primary or secondary SYNC code was selected. At this time, user data is "00." In the present embodiment, for example, selecting the stream defined in the main conversion table as the 16-bit code words is described as "selecting the main table." Likewise, "selecting the substation table" is selecting the stream defined in the substation table as the 16-bit code words. For SYNC, "selecting primary SYNC code" means selecting the stream using the primary SYNC code as SYNC. The same wording is used for secondary SYNC code and states 1 and 4.

In the table, "conventional pattern" is a pattern of selecting main conversion table, state 1, and primary SYNC when the accumulated |DSVs| of two streams are equal and this has been applied conventionally. The edge positions and recording mark and space positions where the bits in the stream were recorded in the conventional pattern are taken as reference positions (0). The edge positions and recording mark and space positions where the bits in the stream were recorded in patterns 1 to 7 are compared with the reference positions. For pattern 1, the percentage fields (at the right) indicate the percentages of the edge positions shifted and recording mark and space positions changed when only SYNC changed, that is, secondary SYNC code instead of primary SYNC code was selected. The edge positions remain unchanged substantially, but the recording mark and space positions changed 50%. This means that polarity inversion occurred (the recording mark and space positions were inverted). For pattern 2, the percentage fields indicate the percentages of the edge positions shifted and recording mark and space positions changed when "state 4" instead of the default "state 1" was selected for the 8-bit data symbols from 88 to 255 with the main conversion table and primary SYNC code still selected. The edge positions shifted 3.74% and the recording mark and space positions changed 48% with regard to the conventional pattern. For pattern 4, the percentage fields indicate the percentages of the edge positions shifted and recording mark and space positions changed when "substitution table" instead of the default "main conversion table" was selected for the 8-bit data symbols from 0 to 87 with state 1 and primary SYNC code still selected. The edge positions shifted 8.67% with regard to the conventional pattern.

By selecting the "substitution table," the recording mark and space position changed 46% The percentage fields for patterns 3, 5, 6, and 7 respectively indicate the percentages of the edge positions shifted and recording mark and space positions changed when main conversion table, state 4, and secondary SYNC code were selected (pattern 3), when substitution table, state 1, and secondary SYNC code were selected (pattern 5), when substitution table, state 4, and primary SYNC code were selected (pattern 6), and when substitution table, state 4, and secondary SYNC code were selected (pattern 7). Under any of these conditions, the edge positions and mark and space positions changed with regard to the conventional pattern. Randomly selecting among these patterns 1 to 7 and the conventional pattern, the invented method records data bits repeatedly and thus suppresses intensive deterioration in fixed positions, even if rewriting of the same user data "00" is repeated.

FIG. 1 is a diagram showing an example of an apparatus configuration in accordance with the present invention for randomly selecting 16-bit code words if the relative relation of the accumulated |DSVs| of two streams satisfies certain conditions, as described above. ECC added code data is converted into 16-bit code words by an 8-16 modulation circuit 11. At this time, for the 8-bit data symbols from 0 to 87, the code words corresponding to the symbols from the main conversion table or the substation table are supplied to a 8-16 modulation block (1) 111. The code words corresponding to the symbols from the other table are supplied to a 8-16 modulation block (2) 112. For the 8-bit data symbols from 88 to 255, the code words corresponding to the symbols in state 1 or state 4 are supplied to the 8-16 modulation block (1) 111. The code words corresponding to the symbols in the other state are supplied to the 8-16 modulation block (2) 112. In this way, two streams of different code words are generated from same user data. The accumulated DSVs of these two data streams are calculated by a DSV calculation block (1) 121 and a DSV calculation block (2) 122, respectively. A |DSV| comparison and selection circuit 13 compares the |DSVs|, normally selects one stream whose |DSV| is smaller, and outputs the stream as recording data.

The apparatus of the present invention is equipped with a randomizer which generates a random signal to randomly select between the two streams, if the relative relation between the accumulated |DSVs| of the two data streams. To the randomizer, a timing signal such as ECC bock and clock is input and a random signal output from the randomizer is input to a register for prioritization 14. The register for prioritization 14 determines a prior DSV (DSV1 or DSV2) in sync with the timing signal and soon sends the prior DSV to the |DSV| comparison and selection circuit 13. A |DSV| threshold value is input to a register 15. For example, if the accumulated |DSVs| of the two data streams are equal as for the patterns listed in Table 1, a value of 0 is input to the register 15. When the difference between the accumulated |DSVs| of the two data streams is less than the value set in the register 15, the |DSV| comparison and selection circuit 13 selects the prior DSV sent from the register for prioritization 14, selects the stream of 16-bit code words with the selected DSV, and outputs the stream as recording data.

Although ECC block and clock are used as the timing signal in FIG. 1, the randomizer may include a pseudo random sequence generator or may generate a random signal from a signal of time or the like asynchronous with write and read operations.

Figure 11:
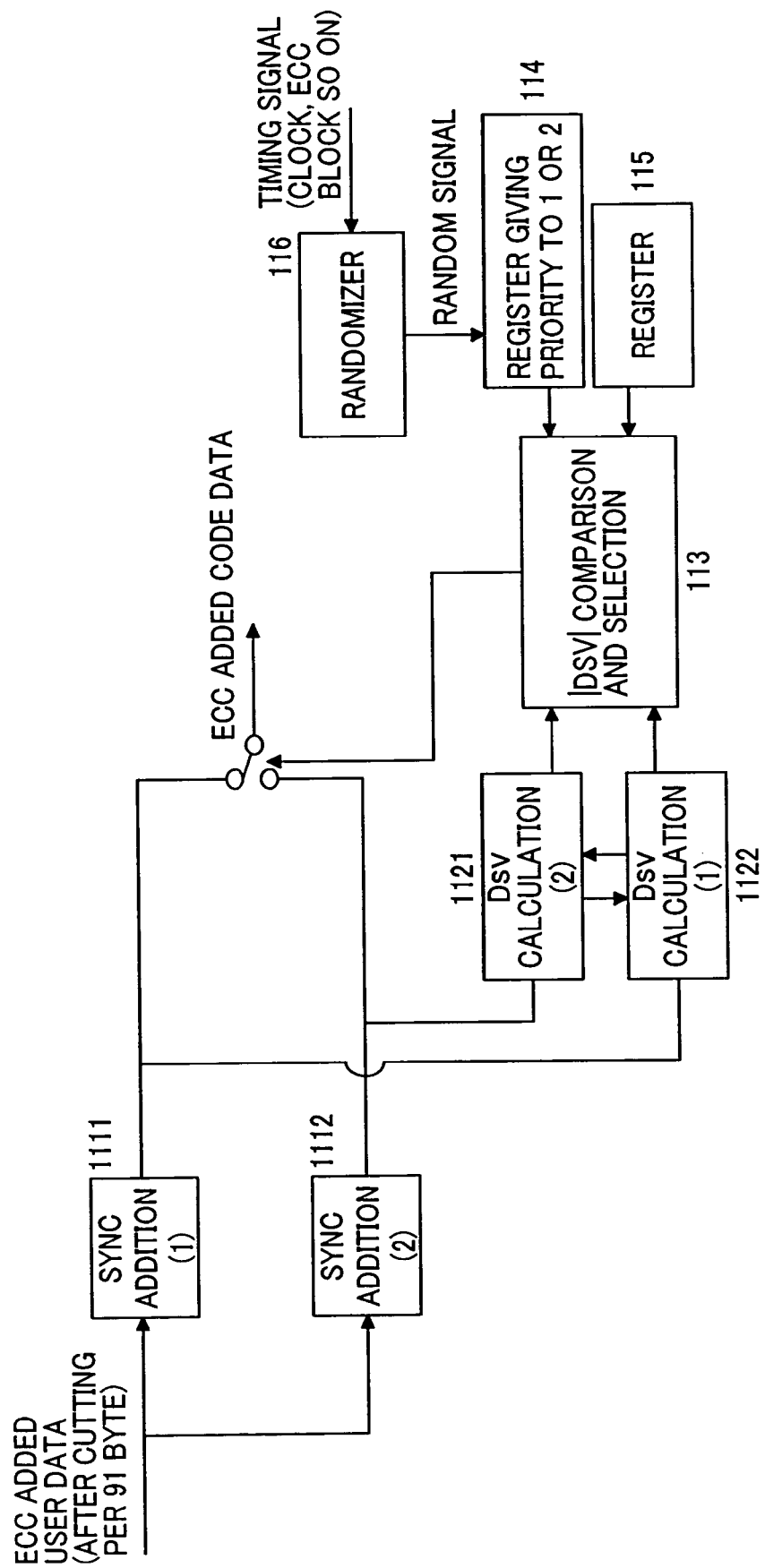
FIG. 11 is a diagram showing a partial structure of a DVD recording apparatus according to the present invention.
Figure 12:
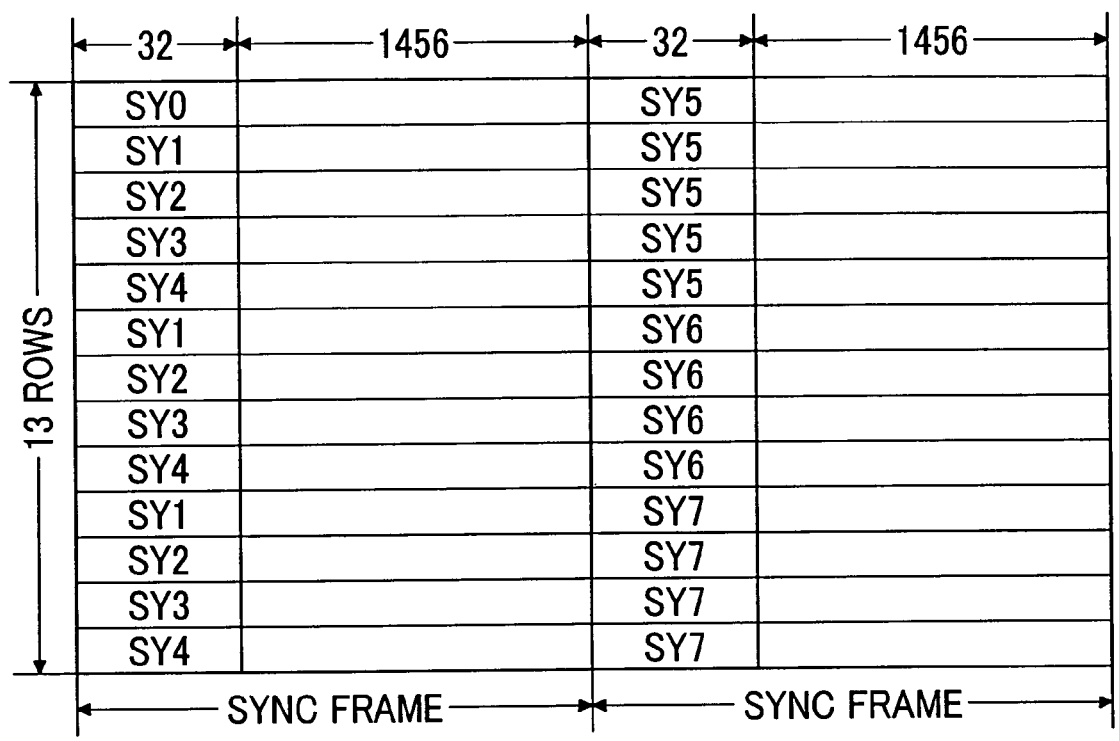
FIG. 12 shows a physical factor configuration.

The apparatus of the present invention is equipped with a randomizer for quasi-randomly selecting either primary or secondary SYNC code, if the |DSVs| of two SYNC added streams satisfy certain conditions, the same as for randomly selecting 16-bit code words. FIG. 11 shows another example of an apparatus configuration in accordance with the present invention. A randomizer 116 shown in FIG. 11 may be used in combination with the randomizer that is used for selecting 16-bit code words, shown in FIG. 1, or may be separately provided for selecting SYNC. To randomly select SYNC, the circuits corresponding to a register for prioritization 114 and a register 115, which are used for randomly selecting 16-bit code words in FIG. 1, may be shared with the circuits used for randomly selecting 16-bit code words, or these registers may be separately provided for selecting SYNC.

Figure 13:
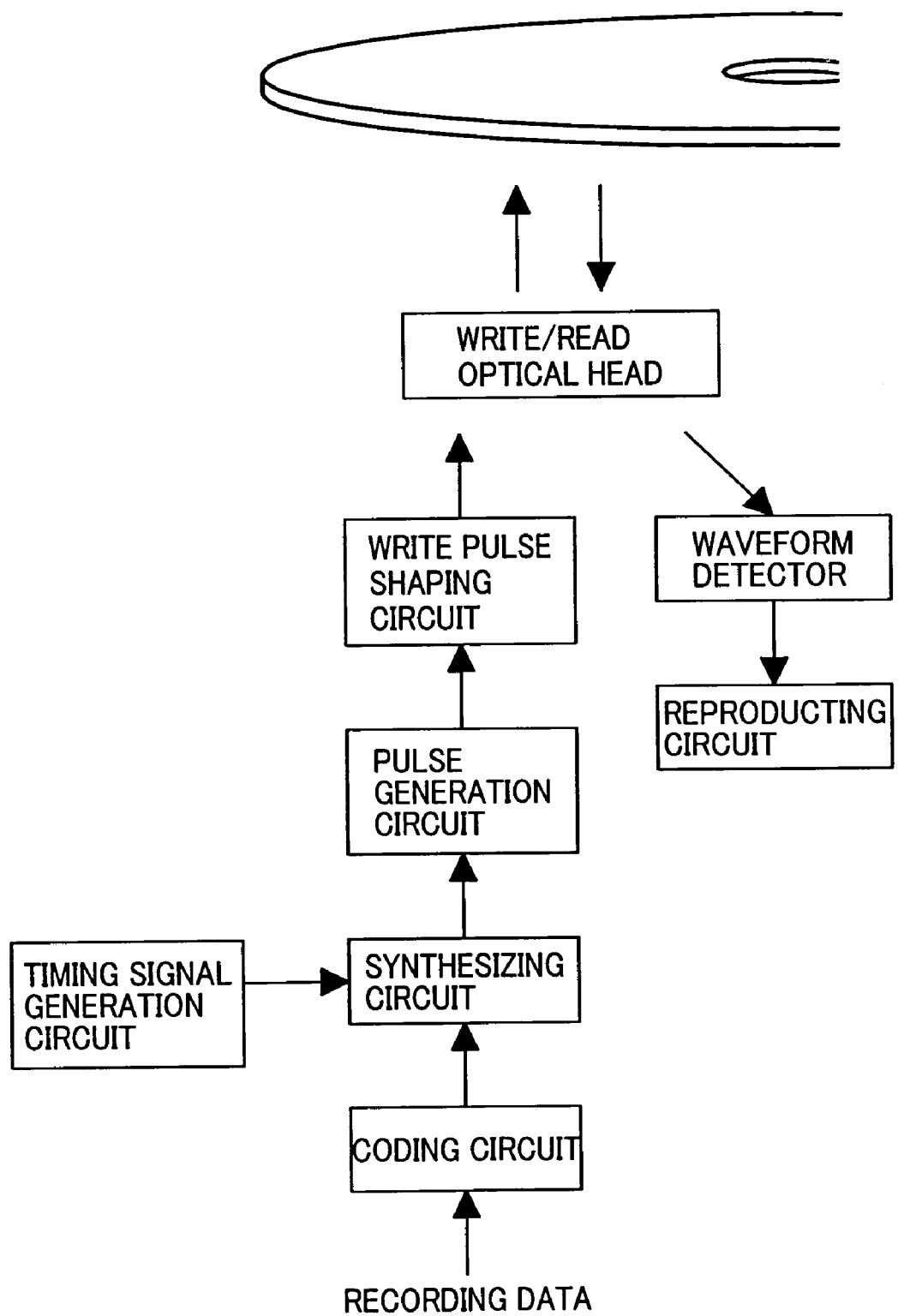
FIG. 13 is an overall structure schematic of the apparatus.

FIG. 13 shows an overall schematic of the apparatus. A coding circuit coverts recording into recording code words and a synthesizing circuit adds a sync signal to the code words. The sync added code words are input to a pulse generation circuit. Then, the pulse generation circuit converts the code words into pulse data and a write pulse shaping circuit shapes the pulse data into pluses which drive the light source.

Using the above apparatus, we repeated recoding data on the disk, while quasi-randomly selecting one of the patterns 1 to 7 and conventional pattern in Table 1, and examined jitter change.

Table 1

TABLE 1

| encode pattern | 8 bit data symbol 0–87 | 8 bit data symbol 88–255 | SYNC code | edge position | difference of recording mark positon and space position |
|---|---|---|---|---|---|
| conventional pattern | Main conversion table | state 1 | Primary | 0.00 | 0 |
| pattern 1 | Main conversion table | state 1 | Secondary | 0.01 | 50 |
| pattern 2 | Main conversion table | state 4 | Primary | 3.74 | 48 |
| pattern 3 | Main conversion table | state 4 | Secondary | 3.76 | 51 |
| pattern 4 | Substitution table | state 1 | Primary | 8.67 | 46 |
| pattern 5 | Substitution table | state 1 | Secondary | 8.68 | 51 |
| pattern 6 | Substitution table | state 4 | Primary | 11.20 | 50 |
| pattern 7 | Substitution table | state 4 | Secondary | 11.21 | 50 |

Figure 3:
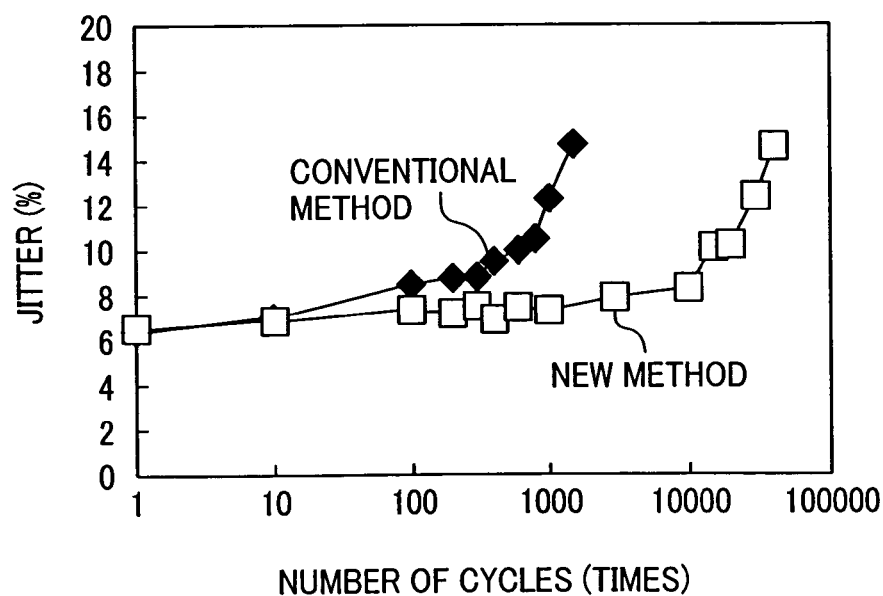
FIG. 3 is a graph showing an example of the effect of the DVD recording method of the present invention.

In this manner, one of the eight patterns is quasi-randomly selected per certain unit of recording (1ECC block in this embodiment) whenever rewriting is performed, which corresponds to the recording mode of (3) described in the Summary section. For comparison purposes, we repeated recording data on the disk only by the conventional pattern and examined jitter change. In the present embodiment, DVD-RW was used as the disk and a write pulse waveform given in the control data zone was used. Results are shown in FIG. 3. In the case of repeated recording only by the conventional pattern, jitter exceeded 13% over 1,000 cycles and an error occurred. In the case where one of the patterns 1 to 7 and conventional pattern was quasi-randomly selected and recording data was repeated, the jitter percentage kept low under 13% up to about 30, 000 cycles, no error was observed, and good repetitive recording and readback performance could be maintained. Like this, by using the present invention, the number of cycles allowed for rewriting sharply increased from on the order of 1,000 cycles (conventional) to about 30,000 cycles.

Figure 4:
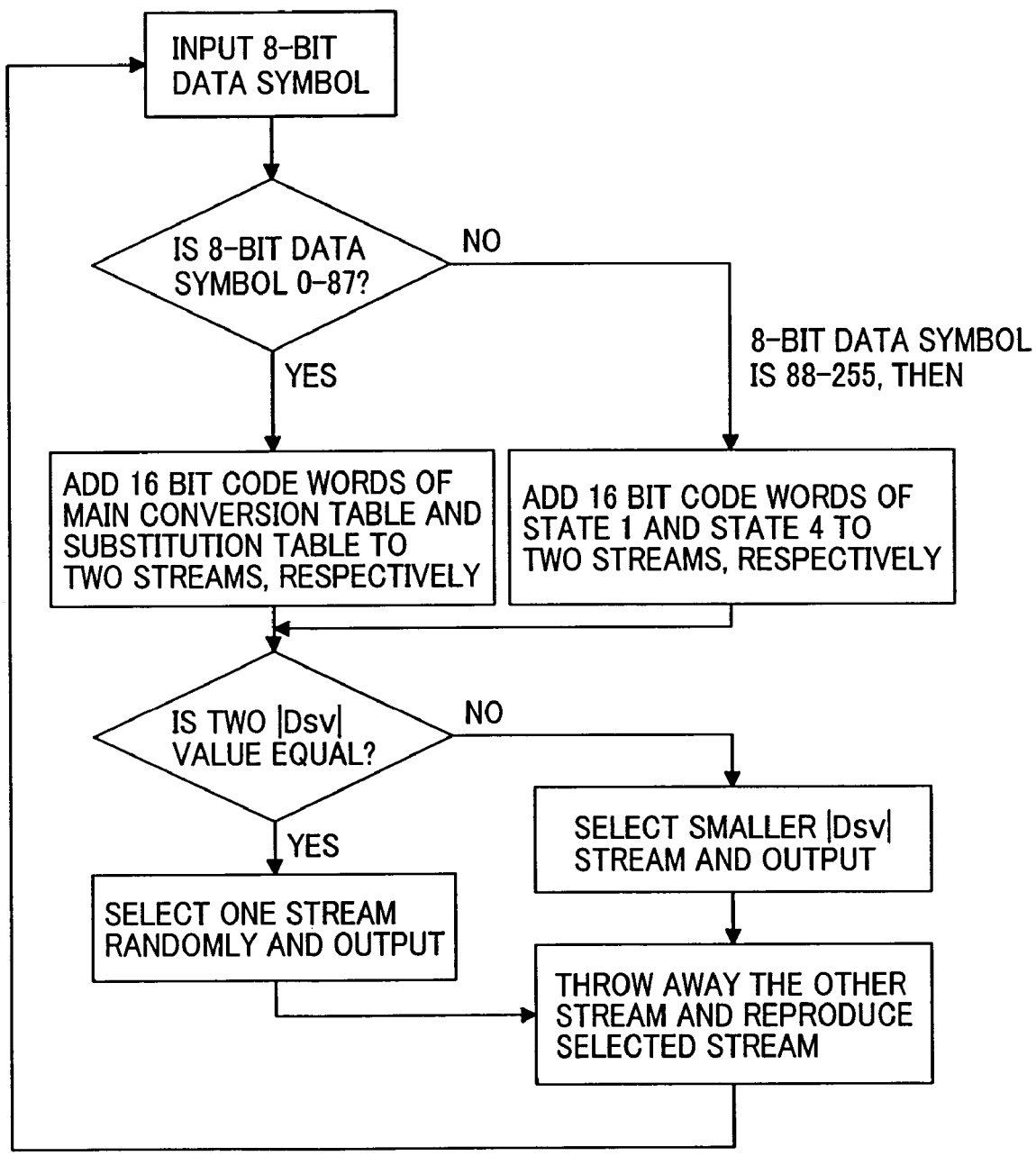
FIG. 4 is a flowchart for explaining the DVD recording method of the present invention.

Using the same DVD-RW disk, then, we examined rewrite performance in the case where encoding was performed, according to the recording mode of (1) described in the Summary section. User data "00" was used. A flowchart explaining the encoding operation is shown in FIG. 4. If 8-bit data symbols 0–87 are input, two streams of code words corresponding to the symbols from the main conversion table and from the substation table, respectively, are obtained. The |DSVs| of the two streams are calculated and compared. If the |DSVs| are equal, either of the two streams is quasi-randomly selected. If the |DSVs| differ, the stream whose |DSV| is smaller is selected. Likewise, if 8-bit data symbols 88–255 are input, two streams of code words corresponding to the symbols in state 1 and in state 4 are obtained. The |DSVs| of the two streams are compared. If the |DSVs| are equal, either of the two streams is quasi-randomly selected. If the |DSVs| differ, the stream whose |DSV| is smaller is selected. When the two streams have equal |DSVs| and when the 16-bit code words corresponding to the symbols from the main conversion table and in state 1 are selected, the recording mode is the same as the above conventional pattern. Therefore, the rewrite performance is the same as the "conventional pattern" in Table 1; that is, about 1,000 cycles allowed for rewriting. In the recording method of the present invention, the number of cycles at a critical point of error and at which jitter is still less than 13% is about 15,000 cycles, which indicates that rewrite performance enhancement to a great extent could be achieved.

Figure 5:
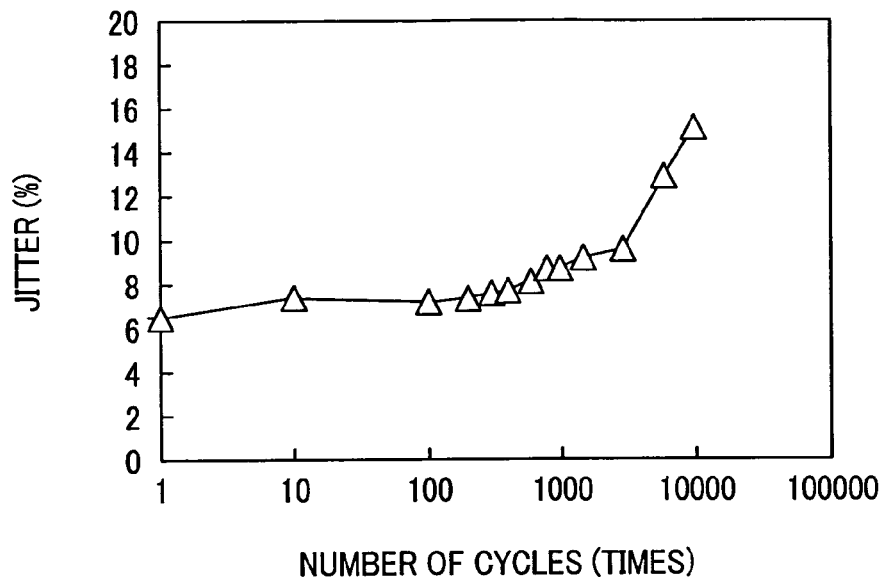
FIG. 5 is a graph showing an example of he effect of the DVD recording method of the present invention.

Furthermore, we examined rewrite performance in the case where the 16-bit code words corresponding to the symbols from the main conversion table and in state 1 were selected as defaults and SYNC was quasi-randomly selected when the accumulated |DSVs| of the two streams are equal, that is, encoding was performed, according to the recording mode of (2) described in the Summary section. In this case, SYNC was selected per sync frame not per 1ECC block. When only the primary SYNC code was selected, the recording mode is the same as the above conventional pattern. Therefore, the rewrite performance is the same as the "conventional pattern" in Table 1. As shown in FIG. 5, as the result of the examination, it turned out that jitter can keep less than 13% up to about 6,000 cycles; that is, the number of cycles increased by a factor of about six as compared with the conventional method can be achieved.

Although DVD-RW is used in the present invention, the same effect can be obtained with DVD+RW and DVD-RAM and the effect of the present invention is the same for rewritable DVDs.

Second Embodiment

In the case where difference between the accumulated |DSVs| of two streams is 10 or less when recording same information while satisfying the DSV control rule of the DVD specifications, Table 2 gives the percentages of edge position shifts and changed recording mark and space positions when either the main conversion table or the substitution table was selected for the 8-bit data symbols from 0 to 87, when either state 1 or state 4 was selected for the 8-bit data symbols from 88 to 255, and when primary or secondary SYNC code was selected. The edge positions and recording mark and space positions where the bits in the stream were recorded in the "conventional pattern" in Table 1 are taken as reference positions (0). User data is "00" as is in Table 2.

Table 2

TABLE 2

| encode pattern | 8 bit data symbol 0–87 | 8 bit data symbol 88–255 | SYNC code | edge position | difference of recording mark positon and space position |
|---|---|---|---|---|---|
| pattern 8 | Main conversion table | state 1 | Primary | 27.25 | 50 |
| pattern 9 | Main conversion table | state 1 | Secondary | 27.16 | 50 |
| pattern 10 | Main conversion table | state 4 | Primary | 28.64 | 49 |
| pattern 11 | Main conversion table | state 4 | Secondary | 29.04 | 50 |
| pattern 12 | Substitution table | state 1 | Primary | 30.38 | 51 |
| pattern 13 | Substitution table | state 1 | Secondary | 30.20 | 50 |
| pattern 14 | Substitution table | state 4 | Primary | 31.22 | 49 |
| pattern 15 | Substitution table | state 4 | Secondary | 30.89 | 50 |

"Pattern 8" is a pattern of selecting main conversion table, state 1, and primary SYNC code, if the difference between the accumulated |DSVs| of the two streams is 10 or less. The selection pattern is the same as the conventional pattern, but differs from the conventional one in that the condition of selection of 16-bit word codes and/or SYNC is widened, that is, "if the difference is 10 or less (the |DSV| threshold value is 10)" not only "if the |DSVs| are equal." Patterns 9 to 15 are also the same selection patterns as patterns 1 to 7 in table 1, respectively, but the |DSV| threshold value of 10 is set for these patterns. From Table 2, it turned out that, by setting the |DSV| threshold value at 10, the edge positions can be changed about 30% and the recording mark and space positions can be changed about 50% under any of the recording conditions of patterns 8 to 15.

Figure 6:
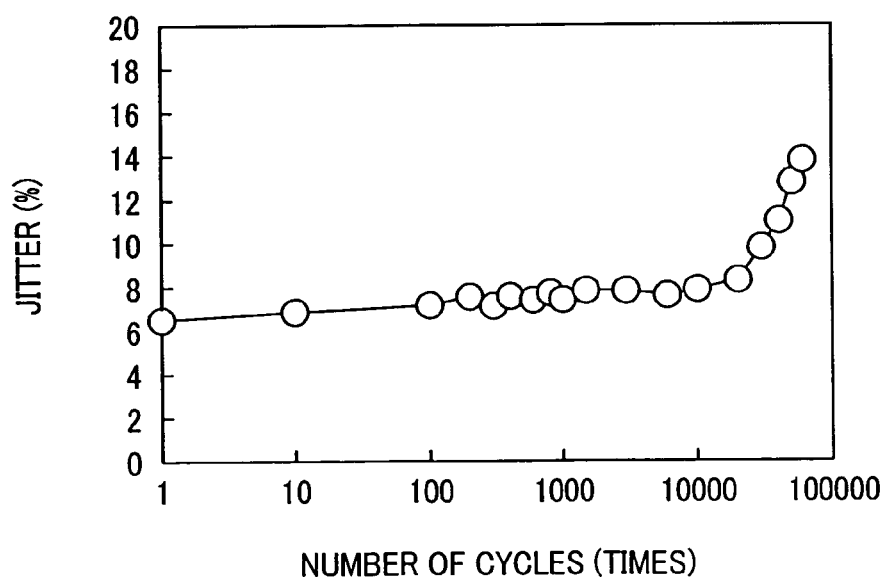
FIG. 6 is a graph showing an example of he effect of the DVD recording method of the present invention.

We repeated recoding data on the disk used in the first embodiment, while quasi-randomly selecting one of the patterns 8 to 15 in Table 2, and examined jitter change. In this manner, one of the eight patterns is quasi-randomly selected per certain unit of recording (1ECC block in this embodiment) whenever rewriting is performed, which corresponds to the recording mode of (6) described in the Summary section. As shown in FIG. 6, as the result of the examination, it turned out that jitter can keep less than 13% up to about 50,000 cycles and the effect of enhancing the rewrite performance is greater than the case where "the condition of selection is that the |DSVs| are equal" in the first embodiment. This effect of enhancing the rewrite performance to a great extent is due to that intensive deterioration in fixed position on the disk was more suppressed. Setting the |DSV| threshold value at 10, as in the present embodiment, did not give rise to deterioration in tracking performance and readback performance such as readback jitter. However, it turned out that setting the |DSV| threshold value greater causes a rise in readback jitter. For example, if the |DSV| threshold value is set at 100, readback jitter after 10 times of overwrite becomes 8.0%, which exceeds an ideal initial jitter of 7%. As we investigated what causes the jitter rise, it turned out that CD components cannot be well suppressed when the |DSV| threshold value is greater than 10 and a slice level offset from an optimum level in an auto-slicer circuit causes jitter to increase.

For the above reason, the |DSV| threshold value should be 10 or less. It is more preferable to set the |DSV| threshold value at 3 or less. Under this condition, the number of cycles is about 40,000 cycles, which is less than when the |DSV| threshold value is set at 10, but the rewrite performance is increased by a factor of about 40 as compared with the conventional method and an sufficient effect of increasing the number of times can be obtained. Furthermore, the rewrite performance can be enhanced without affecting readback performance, even taking account of disk performance variation such as jitter variation and the worst case of environment in which the disk is used. Although DVD-RW is used in the present embodiment, the effect of the present invention is the same for rewritable DVDs.

Third Embodiment

In the present embodiment, when recording new data subsequent to previously recorded data, the DSVs of the data streams recorded in the preceding blocks are measured, the accumulated DSV is set as the initial DSV when the new data is recorded, and encoding is performed. We compared the readback performance of the thus recorded data and the readback performance of data recorded in the conventional method in which the DSV value of new data is initialized to 0.

Figure 7:
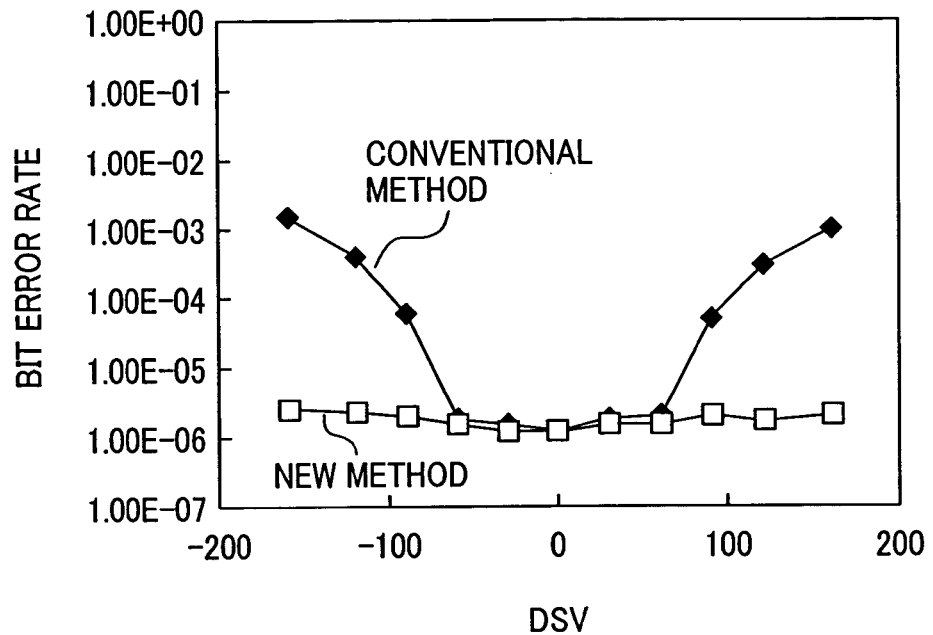
FIG. 7 is a graph showing an example of he effect of the DVD recording method of the present invention.
Figure 8:
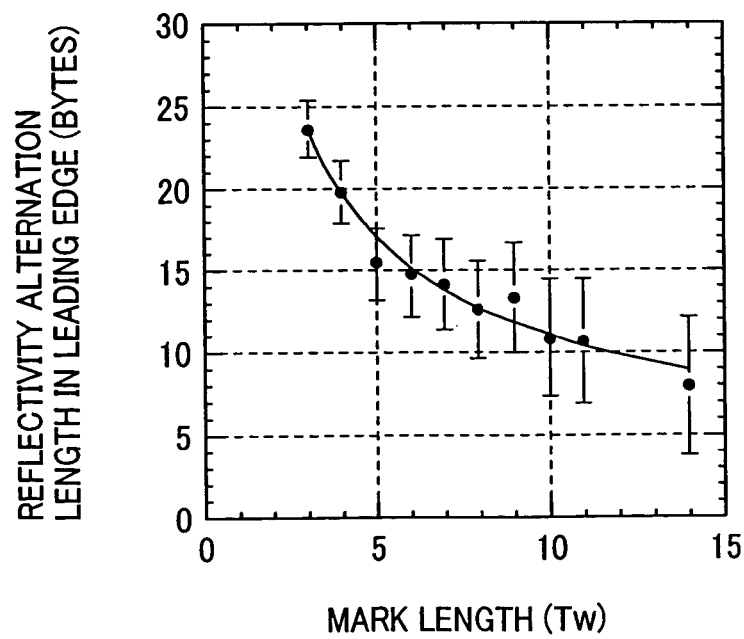
FIG. 8 is a graph showing a relationship between recording mark length and reflectivity alternation length.

We recorded 11 data streams with different accumulated DSVs in advance, and generated channel bit streams to which an initial |DSV|, the sum of these DSVs, was encoded and assigned, recorded the streams and read back. Results are shown in FIG. 7. For comparison purposes, results of readback of data for which new data initial |DSV| was set to 0 and encoded are also shown. In FIG. 7, the abscissa denotes accumulated DSV of old data and the ordinate denotes bit error rate when the data is read. Readback of data recorded in conventional method, that is, for which new data initial |DSV| was set to 0 and encoded, does not differ from the readback of data recorded in the manner of the present invention, if the accumulated |DSV| of old data is 60 or less. However, as this |DSV| becomes higher, the error rate gradually increases in the conventional method. Over 100 of the |DSV|, the bit error rate of readback in the conventional method exceeds a bit error rate of $10^{-4}$ that is regarded as the upper limit of readback performance. However, for the data recorded by the recording method of the present invention, the bit error rate when new data is read remains under $10^{-4}$ over the whole range of measurement and stable readback performance can be achieved.

The present invention is useful for rewritable DVDs such as DVD-RW and DVD+RW.

What is claimed is:

1. A DVD recording method for recording data onto recording media by using a given coding rule, comprising:
    generating two data streams by using a plurality of code mapping variants prepared for coding input data, quasi-randomly selecting one of the plurality of code mapping variants if absolute DSVs of the two data streams are substantially equal, and converting into recording code sequences; and
    recording data onto said recording media, based on said recording code sequences.

2. The DVD recording method according to claim 1, wherein said coding rule is an RLL 8-16 modulation rule, wherein said plurality of code mapping variants comprise 16-bit code words recorded in a main conversion table and 16-bit code words recorded in a substitution table, and
    wherein, when the absolute DSVs of said two data streams are equal, as for 8-bit data symbols from 0 to 87 corresponding to 16-bit code words to be selected, either the stream defined in the main conversion table or the stream defined in the substitution table is quasi-randomly selected.

3. The DVD recording method according to claim 1, wherein said coding rule is an RLL 8-16 modulation rule, and
    wherein, when the absolute DSVs of said two data streams are equal, as for 8-bit data symbols from 88 to 255 corresponding to 16-bit code words to be selected, either the stream defined in state 1 or the stream defined in state 4 is quasi-randomly selected.

4. The DVD recording method according to claim 1, wherein, when the absolute DSVs of said two data streams are equal, SYNC is selected quasi-randomly between primary SYNC code and secondary SYNC code.

5. The DVD recording method according to claim 1, wherein said coding rule is an RLL 8-16 modulation rule, and
    wherein, when the absolute DSVs of said two data streams are equal, a 16-bit code words plus SYNC pattern per unit of recording is selected quasi-randomly from the following eight patterns:
    main conversion table, state 1, and primary SYNC code;
    main conversion table, state 1, and secondary SYNC code;
    main conversion table, state 4, and primary SYNC code;
    main conversion table, state 4, and secondary SYNC code;
    substitution table, state 1, and primary SYNC code;
    substitution table, state 1, and secondary SYNC code;
    substitution table, state 4, and primary SYNC code; and
    substitution table, state 4, and secondary SYNC code.

6. The DVD recording method according to claim 1, wherein a difference between the absolute DSVs of the two data streams generated by using said plurality of code mapping variants is 10 or less.

7. The DVD recording method according to claim 1, wherein said coding rule is an RLL 8-16 modulation rule, wherein said plurality of code mapping variants comprise 16-bit code words recorded in a main conversion table and 16-bit code words recorded in a substitution table, and
    wherein, when a difference between the absolute DSVs of said two data streams generated per sync frame is 10 or less, as for 8-bit data symbols from 0 to 87 corresponding to 16-bit code words to be selected, either the stream defined in the main conversion table or the stream defined in the substitution table is quasi-randomly selected.

8. The DVD recording method according to claim 1, wherein said coding rule is an RLL 8-16 modulation rule, and
    wherein, when a difference between the absolute DSVs for up to 16 bits of said two data streams is 10 or less, as for 8-bit data symbols from 88 to 255 corresponding to 16-bit code words to be selected, either the stream defined in state 1 or the stream defined in state 4 is quasi-randomly selected.

9. The DVD recording method according to claim 1, wherein, when a difference between the absolute DSVs of said two data streams generated per sync frame is 10 or less, SYNC is selected quasi-randomly between primary SYNC code and secondary SYNC code.

10. The DVD recording method according to claim 1, wherein said coding rule is an RLL 8-16 modulation rule, and
    wherein, when a difference between the absolute DSVs of said two data streams is 10 or less, a 16-bit code words plus SYNC pattern per unit of recording is selected quasi-randomly from the following eight patterns:
    main conversion table, state 1, and primary SYNC code;
    main conversion table, state 1, and secondary SYNC code;
    main conversion table, state 4, and primary SYNC code;
    main conversion table, state 4, and secondary SYNC code;
    substitution table, state 1, and primary SYNC code;
    substitution table, state 1, and secondary SYNC code;
    substitution table, state 4, and primary SYNC code; and
    substitution table, state 4, and secondary SYNC code.

11. The DVD recording method according to claim 1, comprising:
    measuring the DSVs of data streams recorded in the preceding blocks to a recording area, setting an accumulated value of the DSVs as the initial DSV when new data is recorded, and encoding the data.

12. A DVD recording apparatus for recording data onto recording media, comprising:
    first and second tables for coding input data;
    selecting means for comparing the absolute DSVs of output code words and selecting either said first or second table according to the DSVs;
    a randomizer for randomly selecting said first or second table;
    means for converting said input data into output code words by referring to said first or second table; and
    means for recording data onto said recording media, based on said output code words.

13. The DVD recording apparatus according to claim 12, wherein said selecting means selects code words whose DSV is smallest as the result of the comparison.

14. The DVD recording apparatus according to claim 12, wherein said DVD recording apparatus retains primary SYNC code and secondary SYNC code, and
said randomizer comprises a function to randomly select between said primary SYNC code and said secondary SYNC code.

15. The DVD recording apparatus according to claim 12, comprising means for calculating the DSVs of code words in said first table and code words in said second table.

* * * * *